(12) United States Patent
Park et al.

(10) Patent No.: US 9,927,670 B2
(45) Date of Patent: Mar. 27, 2018

(54) LIQUID CRYSTAL DISPLAY

(71) Applicant: Samsung Display Co., Ltd., Yongin-Si, Gyeonggi-Do (KR)

(72) Inventors: Jong Hwan Park, Gimhae-si (KR); Jae Hak Lee, Suwon-si (KR); Eun Je Jang, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/944,318

(22) Filed: Nov. 18, 2015

(65) Prior Publication Data

US 2016/0195790 A1 Jul. 7, 2016

(30) Foreign Application Priority Data

Jan. 6, 2015 (KR) .......................... 10-2015-0001277

(51) Int. Cl.
*G02F 1/1362* (2006.01)
*H01L 27/12* (2006.01)

(52) U.S. Cl.
CPC ...... *G02F 1/136286* (2013.01); *H01L 27/124* (2013.01)

(58) Field of Classification Search
CPC ................................................ G02F 1/136286
See application file for complete search history.

(56) References Cited

U.S. PATENT DOCUMENTS

| 7,928,439 B2 | 4/2011 | Jeon et al. | |
| 2012/0127412 A1* | 5/2012 | Lee | G02F 1/1345 349/139 |
| 2014/0144582 A1* | 5/2014 | Kunimatsu | G02F 1/133723 156/272.2 |
| 2014/0225108 A1* | 8/2014 | Yamazaki | H01L 27/1225 257/43 |

FOREIGN PATENT DOCUMENTS

| KR | 10-2003-0014449 A | 2/2003 |
| KR | 10-2005-0001833 A | 1/2005 |
| KR | 10-2005-0077372 A | 8/2005 |

* cited by examiner

*Primary Examiner* — Edmond Lau
(74) *Attorney, Agent, or Firm* — H.C. Park & Associates, PLC

(57) ABSTRACT

There is provided a liquid crystal display including: a first substrate including a display area displaying an image and a peripheral area surrounding the display area; a data line disposed on the first substrate in the display area and including a source electrode; a first gate insulating layer disposed at a portion except for the portion where the data line is disposed on the first substrate; a semiconductor layer disposed on the source electrode; a drain electrode disposed on the semiconductor layer; a gate line disposed on the first gate insulating layer in the display area and including a gate electrode; and a second gate insulating layer disposed between the gate electrode on the first gate insulating layer and the semiconductor layer, in which the gate line and the data line extend in the same direction to each other.

15 Claims, 7 Drawing Sheets

LIQUID CRYSTAL DISPLAY

CLAIM OF PRIORITY

This application claims the priority of and all the benefits accruing under 35 U.S.C. 119 of Korean Patent Application No. 10-2015-0001277 filed in the Korean Intellectual Property Office (KIPO) on Jan. 6, 2015, the entire contents of which are incorporated herein by reference.

BACKGROUND OF THE INVENTION

Field of the Invention

The present invention relates to a liquid crystal display.

Description of the Related Art

A liquid crystal display which is one of the most common types of flat panel displays currently in use, includes two display panels with field generating electrodes such as a pixel electrode and a common electrode and a liquid crystal layer interposed therebetween.

The liquid crystal display generates an electric field in the liquid crystal layer by applying voltage to the field generating electrodes, and determines the directions of liquid crystal molecules of the liquid crystal layer by the generated electric field, thus controlling polarization of incident light so as to display images.

The liquid crystal display further includes a thin film transistor connected to each pixel electrode and a plurality of signal lines such as gate lines and data liens for applying a voltage to the pixel electrode by controlling the thin film transistor, and a driver for applying a control signal or voltage to each signal line.

Meanwhile, the liquid crystal display includes a display area displaying an image and a peripheral area surrounding the display area, and the driver is positioned in the peripheral area. There is a limit in reducing the size of the peripheral area by reducing the size of the driver.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a side liquid crystal display having advantages of reducing a width of a peripheral area.

An exemplary embodiment of the present invention provides a liquid crystal display including: a first substrate including a display area displaying an image and a peripheral area surrounding the display area; a data line disposed on the first substrate in the display area and including a source electrode; a first gate insulating layer disposed at a portion except for the portion where the data line is disposed on the first substrate; a semiconductor layer disposed on the source electrode; a drain electrode disposed on the semiconductor layer; a gate line disposed on the first gate insulating layer in the display area and including a gate electrode; and a second gate insulating layer disposed between the gate electrode on the first gate insulating layer and the semiconductor layer, in which the gate line and the data line extend in the same direction to each other.

The gate line and the data line may be adjacent to each other.

The thickness of the source electrode may be the same as the thickness of the first gate insulating layer.

The liquid crystal display may further include: a passivation layer disposed on the first gate insulating layer, the gate line, the second gate insulating layer, the data line, and the drain electrode and including a contact hole exposing the drain electrode; and a pixel electrode disposed on the passivation layer and connected with the drain electrode through the contact hole.

In the pixel electrode, an X-axis directional length may be larger than a Y-axis directional length.

The liquid crystal display may further include: a second substrate facing the first substrate; a light blocking member and a color filter disposed on second substrate; a common electrode disposed on the light blocking member and the color filter; and a liquid crystal layer disposed between the first substrate and the second substrate.

The liquid crystal display may further include: a first passivation layer disposed on the first gate insulating layer, the gate line, the second gate insulating layer, the data line, and the drain electrode; a common electrode disposed on the first passivation layer; a second passivation layer disposed on the first passivation layer and the common electrode; and a pixel electrode disposed on the second passivation layer, in which a contact hole exposing the drain electrode may be formed in the first passivation layer and the second passivation layer, and the pixel electrode may be connected with the drain electrode through the contact hole.

The pixel electrode may include a plurality of branch electrodes.

The liquid crystal display may further include: a second substrate facing the first substrate; a light blocking member and a color filter disposed on the second substrate; and a liquid crystal layer disposed between the first substrate and the second substrate.

The liquid crystal display may further include: a first passivation layer disposed on the first gate insulating layer, the gate line, the second gate insulating layer, the data line, and the drain electrode and including a contact hole exposing the drain electrode; a pixel electrode disposed on the first passivation layer and connected with the drain electrode through the contact hole; a second passivation layer disposed on the first passivation layer and the pixel electrode; and a common electrode disposed on the second passivation layer.

The common electrode may include a plurality of branch electrodes.

The liquid crystal display may further include: a gate driver disposed in the peripheral area and connected with the gate line; and a data driver disposed in the peripheral area and connected with the data line, in which the gate driver and the data driver face each other with the display area therebetween.

According to the exemplary embodiment of the present invention, the gate driver and the data driver are disposed on and below the display area on a plane, respectively, to reduce a horizontal width of the liquid crystal display, that is, a width of the peripheral area positioned on the left and right sides of the display area on the plane.

Further, the channel of the thin film transistor is formed in a vertical direction to the first substrate to control a thickness of the semiconductor layer, thereby controlling a length of the channel of the thin film transistor.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF INVENTION

Figure 1:
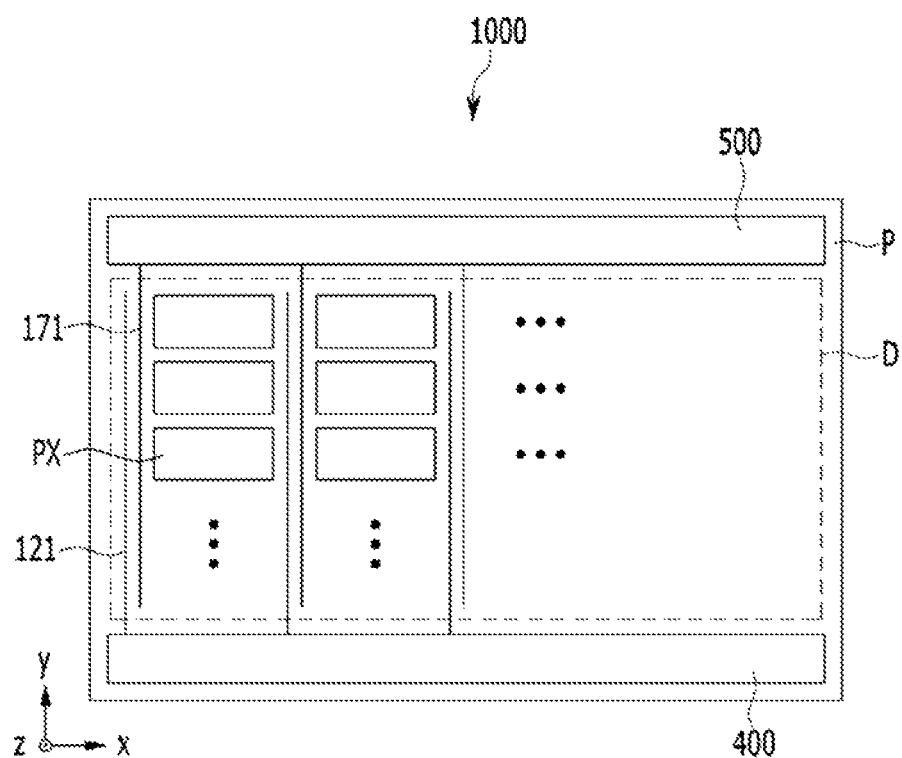
FIG. 1 is a diagram schematically illustrating a liquid crystal display according to an exemplary embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Accordingly, the drawings and description are to be regarded as illustrative in nature and not restrictive. Like reference numerals designate like elements throughout the specification.

In addition, the size and thickness of each configuration shown in the drawings are arbitrarily shown for understanding and ease of description, but the present invention is not limited thereto.

In the drawings, the thickness of layers, films, panels, regions, etc., are exaggerated for clarity. In the drawings, for understanding and ease of description, the thickness of some layers and areas is exaggerated. It will be understood that when an element such as a layer, film, region, or substrate is referred to as being "on" another element, it can be directly on the other element or intervening elements may also be present.

In addition, unless explicitly described, to the contrary, the word "comprise" and variations such as "comprises" or "comprising", will be understood to imply the inclusion of stated elements but not the exclusion of any other elements. Further, throughout the specification, the word "on" means positioning on or below the object portion, but does not essentially mean positioning on the upper side of the object portion based on a gravity direction.

Further, throughout the specification, the word "on a plane" means viewing a target portion from the top, and the word "on a cross section" means viewing a cross section formed by vertically cutting a target portion from the side.

Then, a liquid crystal display according to an exemplary embodiment of the present invention will be described with reference to FIGS. 1 to 3.

FIG. 1 is a diagram schematically illustrating a liquid crystal display according to an exemplary embodiment of the present invention.

Referring to FIG. 1, a liquid crystal display 1000 according to the present exemplary embodiment includes a gate driver 400, a data driver 500, a plurality of gate lines 121 transferring gate signals, a plurality of data lines 171 transferring data voltages, and a plurality of pixels PX arranged substantially in a matrix form.

Further, the liquid crystal display 1000 according to the present exemplary embodiment includes a display area D displaying an image and a peripheral area P surrounding the display area D. The plurality of pixels PX, the plurality of gate lines 121, and the plurality of data lines 171 are disposed in the display area D, and the gate driver 400 and the data driver 500 are disposed in the peripheral area P.

The gate driver 400 and the data driver 500 are disposed below and above the display area D on a plane, respectively. That is, the gate driver 400 and the data driver 500 face each other with the display area D therebetween. The pixel PX is connected with the gate line 121 and the data line 171, and an X-axis directional length of the pixel PX is larger than a Y-axis directional length thereof. The gate line 121 is connected to the gate driver 400, and the data line 171 is connected to the data driver 500. The gate line 121 and the data line 171 extend in a Y-axial direction and are substantially parallel to each other. The gate driver 400, the data driver 500, the gate line 121, and the data line 171 are disposed on a first substrate 110 to be described below.

As such, the gate driver 400 and the data driver 500 are disposed below and above the display area L) on the plane, respectively, to reduce a horizontal width of the liquid crystal display 1000, that is, a width of the peripheral area P positioned at the left and right sides of the display area D on the plane.

Figure 2:
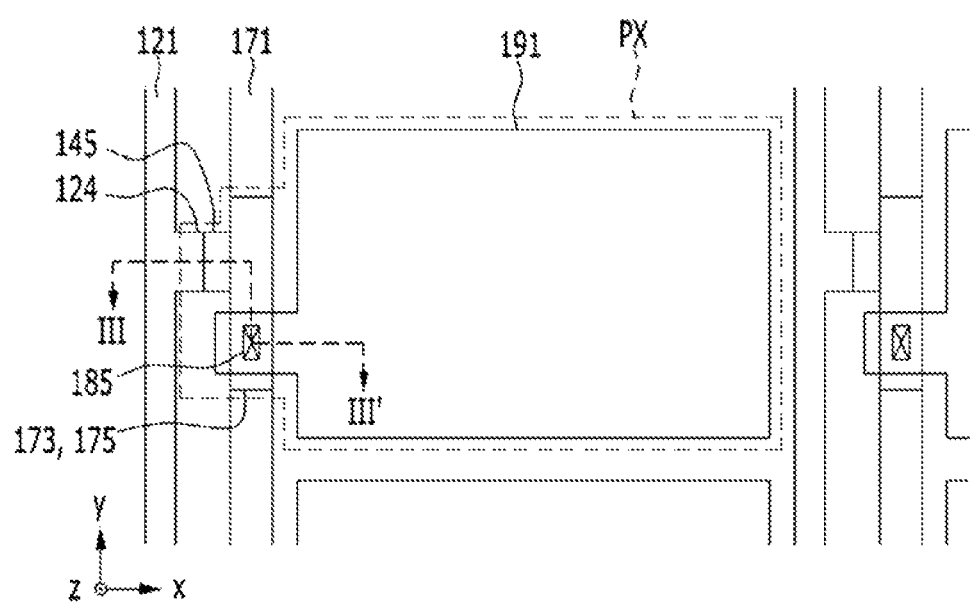
FIG. 2 is a layout view enlarging a pixel of the liquid crystal display of FIG. 1 according to the present invention.

FIG. 2 is a layout view enlarging a pixel of the liquid crystal display of FIG. 1 according to the present invention. FIG. 3 is a cross-sectional view illustrating the liquid crystal display of FIG. 2 taken along line III-III'.

Figure 3:
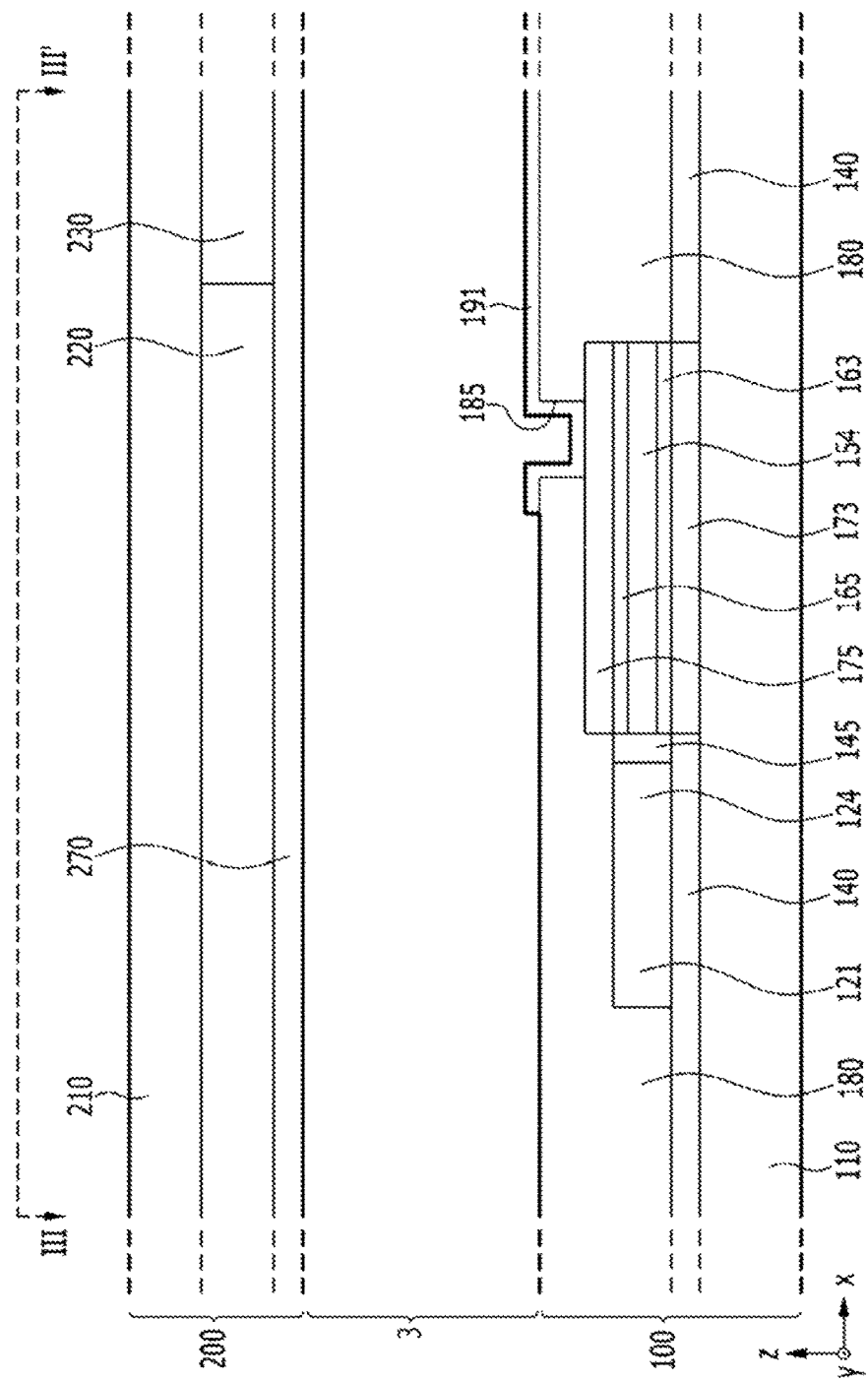
FIG. 3 is a cross-sectional view illustrating the liquid crystal display of FIG. 2 taken along line III-III'.

Referring to FIGS. 2 and 3, the liquid crystal display according to the exemplary embodiment includes a first display panel 100 and a second display panel 200 facing each other, and a liquid crystal layer 3 interposed between the first and second display panels 100 and 200.

On the first display panel 100, the pixel PX, and the gate line 121 and the data line 171 connected to the pixel PX are disposed. Here, the pixel PX includes a gate electrode 121, a source electrode 173, a semiconductor layer 154, a drain electrode 175, and a pixel electrode 191.

First, the first display panel 100 will be described.

The data line 171 and a first gate insulating layer 140 are disposed on the first substrate 110 made of transparent glass, plastic, or the like.

The data line 171 mainly extends in a vertical direction and includes a source electrode 173.

The gate insulating layer 140 may be made of an inorganic insulating material such as silicon nitride (SiNx) and silicon oxide (SiOx). The first gate insulating layer 140 is disposed at a portion except for a portion where the data line 171 is disposed on the first substrate 110. Further, a thickness of the first gate insulating layer 140 may be the same as a thickness of the data line 171.

On the source electrode 173, a first ohmic contact layer 163, a semiconductor layer 154, a second ohmic contact layer 165, and a drain electrode 175 are sequentially disposed.

The semiconductor layer 154 may be made of amorphous silicon or polycrystalline silicon. Further, the semiconductor layer 154 may also be formed by an oxide semiconductor.

The first ohmic contact layer 163 and the second ohmic contact layer 165 may be made of a material such as hydrogenated amorphous silicon on which n-type impurities are doped at a high concentration. Further, the first ohmic contact layer 163 and the second ohmic contact layer 165 may be made of silicide. Meanwhile, when the semiconductor layer 154 is formed by the oxide semiconductor, the first ohmic contact layer 163 and the second ohmic contact layer 165 may be omitted.

Here, planar shapes of the source electrode 173, the first ohmic contact layer 163, the semiconductor layer 154, the second ohmic contact layer 165, and the drain electrode 175 may be the same as each other. Further, sides of the source electrode 173, the first ohmic contact layer 163, the semiconductor layer 154, the second ohmic contact layer 165, and the drain electrode 175 may be tapered with respect to the first substrate 110.

On the first gate insulating layer 140, the gate line 121 and the second gate insulating layer 145 are disposed.

The gate line 121 is adjacent to the data line 171 and extends in a parallel direction with the data line 171. Further, the gate line 121 includes a gate electrode 124 protruding in a source electrode 173 direction.

The second gate insulating layer 145 is disposed between the gate electrode 124 and the first ohmic contact layer 163, the semiconductor layer 154, and the second ohmic contact layer 165.

A thickness of the gate electrode 124 may be the same as a thickness which is the sum of thicknesses of the first ohmic contact layer 163, the semiconductor layer 154, and the second ohmic contact layer 165. Meanwhile, when the first ohmic contact layer 163 and the second ohmic contact layer 165a are omitted, the thickness of the gate electrode 124 may be the same as the thickness of the semiconductor layer 154.

The gate electrode 124, the source electrode 173, and the drain electrode 175 form a thin film transistor (TFT) together with the semiconductor layer 154, and a channel of the thin film transistor is formed in the semiconductor layer 154 between the source electrode 173 and the drain electrode 175. That is, the channel of the thin film transistor is formed in a vertical direction to the first substrate 110, and as a result, a length of the channel of the thin film transistor may be controlled by controlling the thickness of the semiconductor layer 154.

On the first gate insulating layer 140, the gate line 121, the second gate insulating layer 145, and the drain electrode 175, a passivation layer 180 is disposed.

The passivation layer 180 may be made of an inorganic insulating material such as silicon nitride or silicon oxide. Further, the present invention is not limited thereto, and the passivation layer 180 may have a double-layered structure including an inorganic layer made of an inorganic insulating material and an organic layer made of an organic insulating material. A contact hole 185 exposing the drain electrode 175 is formed in the passivation layer 180.

The pixel electrode 191 connected with the drain electrode 175 through the contact hole 185 is disposed on the passivation layer 180. The pixel electrode 191 has a substantially quadrangular shape and a structure in which the X-axis directional length is larger than the Y-axis directional length. The pixel electrode 191 may be made of a transparent metal material such as indium tin oxide (ITO) or indium zinc oxide (IZO).

Next, the second display panel 200 will be described.

A light blocking member 220, a color filter 230, and a common voltage 270 are disposed on a second substrate 210 made of transparent glass, plastic, or the like. The light blocking member 220 partitions the pixel area, and the color filter 230 is disposed in a region partitioned by the light blocking member 220. The common electrode 270 is disposed on the light blocking member 220 and the color filter 230.

Meanwhile, an overcoat may be disposed between the color filter 230 and the common electrode 270. In this case, the overcoat may prevent the color filter 230 from being lifted and suppress the contamination of the liquid crystal layer 3 due to an organic material such as a solvent flowing into from the color filter 230, thereby preventing defects such as an afterimage which may be caused when a screen is driven.

Further, the present invention is not limited thereto, and the light blocking member 220 and the color filter 230 may also be positioned on the first display panel 100.

The pixel electrode 191 receives a data voltage from the drain electrode 175, and the common electrode 270 receives a common voltage having a predetermined magnitude from the outside of the display area D.

The pixel electrode 191 and the common electrode 270, which are field generating electrodes generate an electric field, and thus the liquid crystal molecules of the liquid crystal layer 3 positioned between the pixel electrode 191 and the common electrode 270 are tilted in a parallel direction with the direction of the electric field. Polarization of light passing through the liquid crystal layer varies according to the slopes of the liquid crystal molecules determined as described above.

Meanwhile, alignment layers (not illustrated) are disposed on inner surfaces of the first and second display panels 100 and 200 and may be vertical alignment layers.

Further, polarizers (not illustrated) are provided on outer surfaces of the first and second display panels 100 and 200, and transmissive axes of the two polarizers are orthogonal to each other, and one transmissive axis thereof may be parallel to the gate line 121. However, the polarizer may be disposed only on the outer surface of any one of the first and second display panels 100 and 200.

Hereinafter, a liquid crystal display according to another exemplary embodiment of the present invention will be described with reference to FIGS. 4 to 7.

Figure 4:
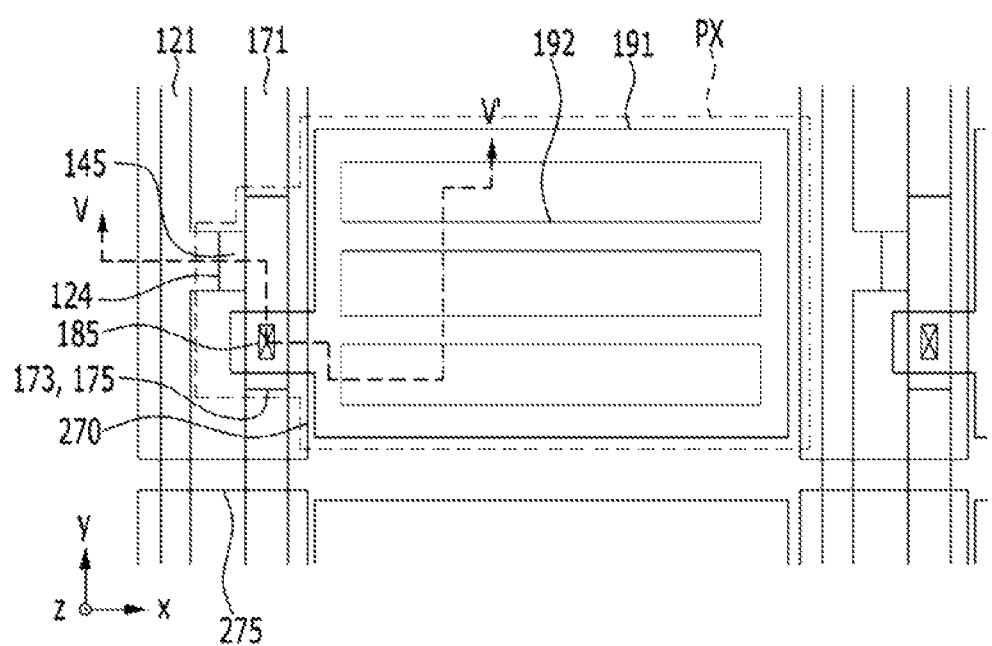
FIG. 4 is a layout view illustrating a liquid crystal display according to another exemplary embodiment of the present invention.
Figure 5:
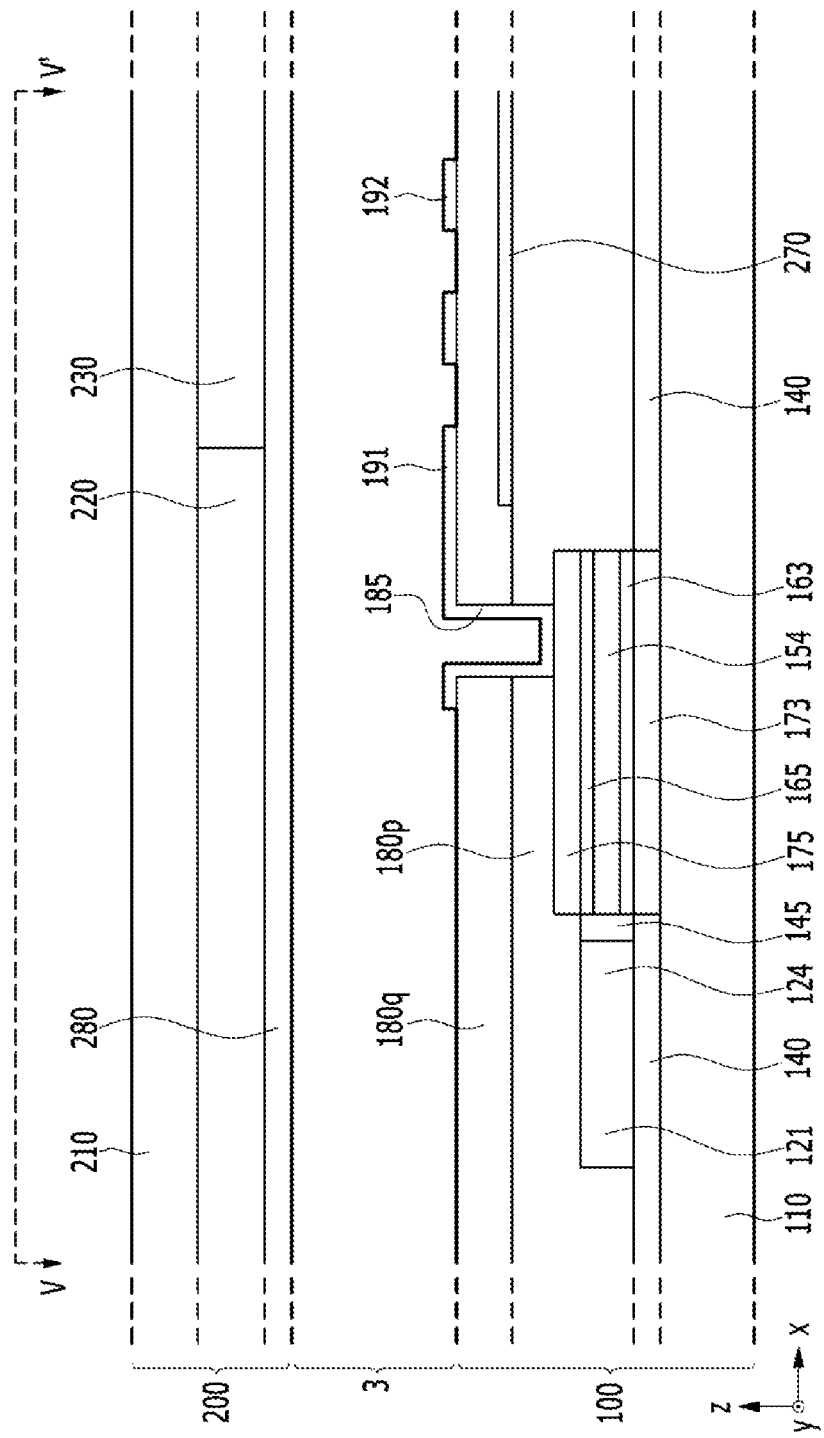
FIG. 5 is a cross-sectional view of the liquid crystal display of FIG. 4 taken along line V-V'.

FIG. 4 is a layout view illustrating a liquid crystal display according to another exemplary embodiment of the present invention. FIG. 5 is a cross-sectional view of the liquid crystal display of FIG. 4 taken along line V-V'.

When the liquid crystal display in FIGS. 4 and 5 is compared with the liquid crystal display in FIG. 1, only a structure of the pixel PX and a structure of the second display panel 200 are different, but other structures are the same. Accordingly, the structure of the pixel PX will be mainly described.

The liquid id crystal display according to the exemplary embodiment includes a first display panel 100 and a second display panel 200 facing each other, and a liquid crystal layer 3 interposed between the first and second display panels 100 and 200.

On the first display panel 100, the pixel PX, and the gate line 121 and the data line 171 connected to the pixel PX are disposed. Here, the pixel PX includes a gate electrode 121, a source electrode 173, a semiconductor layer 154, a drain electrode 175, a pixel electrode 191, and a common electrode 270.

First, the first display panel 100 will be described.

The data line 171 and a first gate insulating layer 140 are disposed on the first substrate 110 made of transparent glass, plastic, or the like.

The data line 171 mainly extends in a vertical direction and includes a source electrode 173.

The gate insulating layer 140 may be made of an inorganic insulating material such as silicon nitride (SiNx) and silicon oxide (SiOx). The first gate insulating layer 140 is disposed at a portion except for a portion where the data line 171 is disposed on the first substrate 110. Further, a thickness of the first gate insulating layer 140 may be the same as a thickness of the data line 171.

On the source electrode 173, a first ohmic contact layer 163, a semiconductor layer 154, a second ohmic contact layer 165, and a drain electrode 175 are sequentially disposed.

The semiconductor layer 154 may be made of amorphous silicon or polycrystalline silicon. Further, the semiconductor layer 154 may also be formed by an oxide semiconductor.

The first ohmic contact layer 163 and the second ohmic contact layer 165 may be made of a material such as n+ hydrogenated amorphous silicon on which n-type impurities are doped at a high concentration. Further, the first ohmic contact layer 163 and the second ohmic contact layer 165 may be made of silicide. Meanwhile, when the semiconductor layer 154 is formed by the oxide semiconductor, the first ohmic contact layer 163 and the second ohmic contact layer 165 may be omitted.

Here, planar shapes of the source electrode 173, the first ohmic contact layer 163, the semiconductor layer 154, the second ohmic contact layer 165, and the drain electrode 175 may be the same as each other. Further, sides of the source electrode 173, the first ohmic contact layer 163, the semiconductor layer 154, the second ohmic contact layer 165, and the drain electrode 175 may be tapered with respect to the first substrate 110.

On the first gate insulating layer 140, the gate line 121 and the second gate insulating layer 145 are disposed.

The gate line 121 is adjacent to the data line 171 and extends in a parallel direction with the data line 171. Further, the gate line 121 includes a gate electrode 124 protruding in a source electrode 173 direction.

The second gate insulating layer 145 is disposed between the gate electrode 124 and the first ohmic contact layer 163, the semiconductor layer 154, and the second ohmic contact layer 165.

A thickness of the gate electrode 124 may be the same as a thickness which is the sum of thicknesses of the first ohmic contact layer 163, the semiconductor layer 154, and the second ohmic contact layer 165.

The gate electrode 124, the source electrode 173, and the drain electrode 175 form a thin film transistor (TFT) together with the semiconductor layer 154, and a channel of the thin film transistor is formed in the semiconductor layer 154 between the source electrode 173 and the drain electrode 175. That is, the channel of the thin film transistor is formed in a vertical direction to the first substrate 110, and as a result, a length of the channel of the thin film transistor may be controlled by controlling the thickness of the semiconductor layer 154.

On the first gate insulating layer 140, the gate line 121, the second gate insulating layer 145, and the drain electrode 175, a first passivation layer 180p is disposed.

The first passivation layer 180p may be made of an inorganic insulating material such as silicon nitride or silicon oxide.

The common electrode 270 is disposed on the first passivation layer 180p. The common electrode 270 has a plate planar shape and may be disposed in the pixel as a whole plate. The common electrode 270 is connected with the common electrode 270 disposed in an adjacent pixel in a row direction through a connection part 275 and may receive a common voltage having a predetermined magnitude which is supplied from the outside of the display area D.

A second passivation layer 180q is disposed on the first passivation layer 180p and the common electrode 270. The second passivation layer 180q may be made of an organic insulating material.

In the first passivation layer 180p and the second passivation layer 180q, a contact hole 185 exposing the drain electrode 175 is formed.

The pixel electrode 191 connected with the drain electrode 175 is disposed on the second passivation layer 180q through the contact hole 185. The pixel electrode 191 has a substantially quadrangular shape and a structure in which the X-axis directional length is larger than the Y-axis directional length. Further, the pixel electrode 191 includes a plurality of branch electrodes 192.

Next, the second display panel 200 will be described.

A light blocking member 220 and a color filter 230 are disposed on a second substrate 210 made of transparent glass, plastic, or the like. The light blocking member 220 partitions the pixel area, and the color filter 230 is disposed in a region partitioned by the light blocking member 220.

Meanwhile, an overcoat 280 may be disposed on the color filter 230. In this case, the overcoat 280 may prevent the color filter 230 from being lifted and suppress the contamination of the liquid crystal layer 3 due to an organic material such as a solvent flowing into from the color filter 230, thereby preventing defects such as an afterimage which may be caused when a screen is driven.

Further, the present invention is not limited thereto, and the light blocking member 220 and the color filter 230 may also be positioned on the first display panel 100.

The pixel electrode 191 receives a data voltage from the drain electrode 175, and the common electrode 270 receives a common voltage having a predetermined magnitude from the outside of the display area D.

The pixel electrode 191 and the common electrode 270, which are field generating electrodes generate an electric field, and thus the liquid crystal molecules of the liquid crystal layer 3 positioned on the pixel electrode 191 and the common electrode 270 rotate in a parallel direction with the direction of the electric field. Polarization of light passing through the liquid crystal layer varies according to the rotation directions of the liquid crystal molecules determined as described above.

Figure 6:
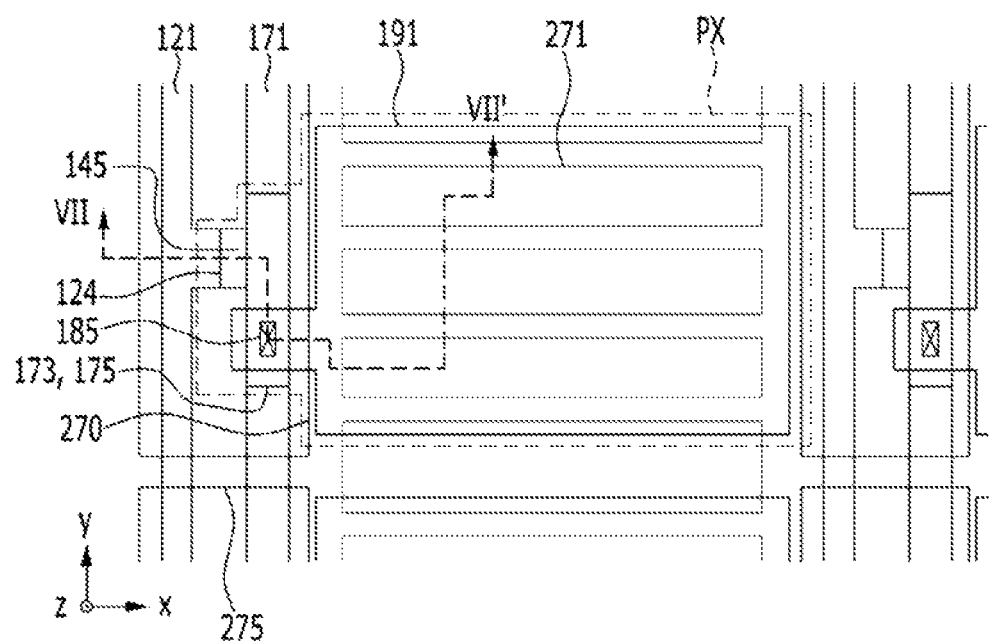
FIG. 6 is a layout view of a liquid crystal display according to yet another exemplary embodiment of the present invention.
Figure 7:
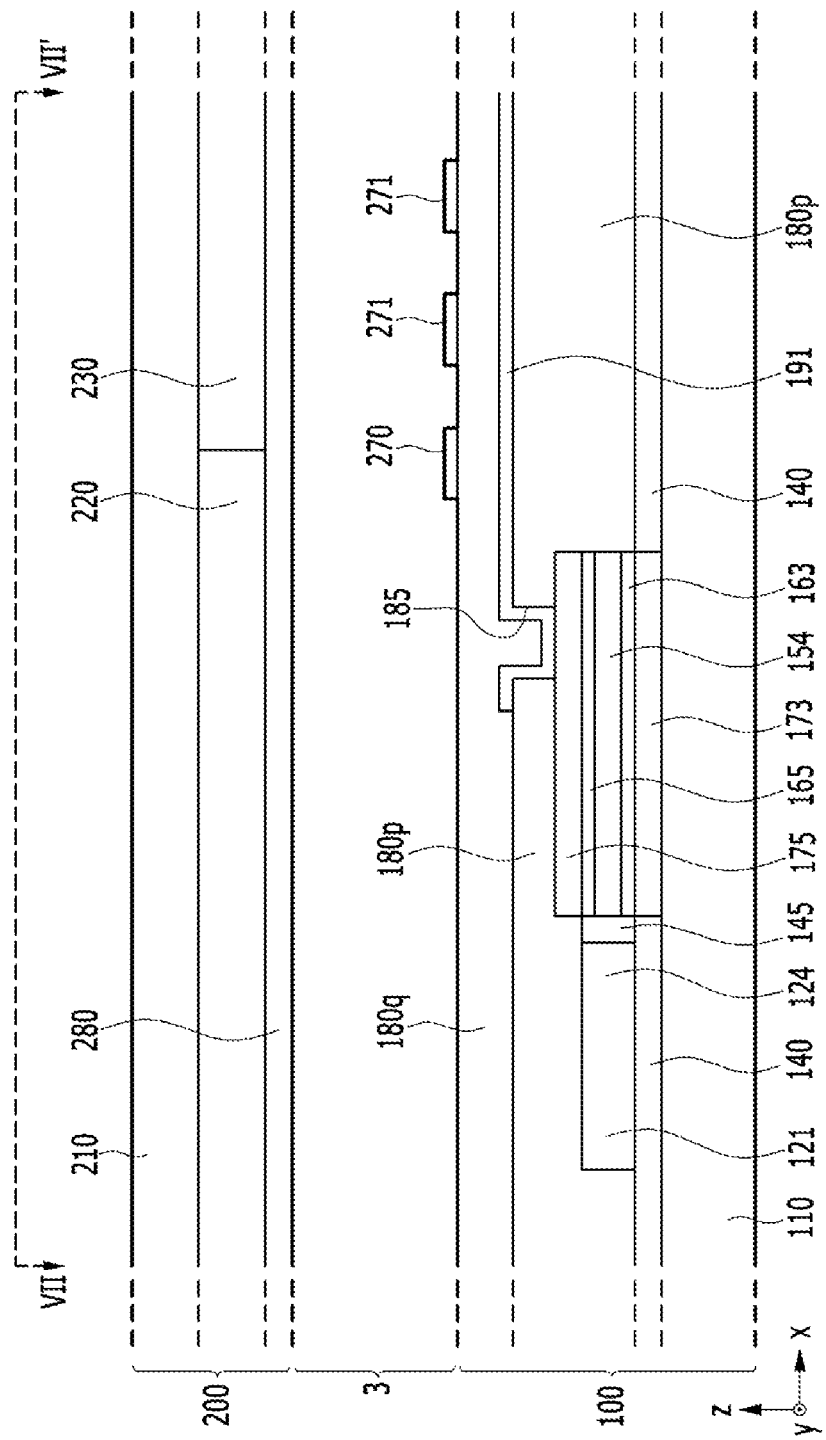
FIG. 7 is a cross-sectional view illustrating the liquid crystal display of FIG. 6 taken along line VII-VII'.

FIG. 6 is a layout view of a liquid crystal display according to yet another exemplary embodiment of the present invention. FIG. 7 is a cross-sectional view illustrating the liquid crystal display of FIG. 6 taken along line VII-VII'.

Referring to FIGS. 6 and 7, when the liquid crystal display according to the exemplary embodiment is compared with the liquid crystal display in FIGS. 4 and 5, structures of the pixel electrode and the common electrode are different, but other structures are substantially similar. Accordingly, similar structures will be briefly described.

The liquid crystal display according to the exemplary embodiment includes a first display panel 100 and a second display panel 200 facing each other, and a liquid crystal layer 3 interposed between the two display panels 100 and 200.

On the first display panel 100, the pixel PX, and the gate line 121 and the data line 171 connected to the pixel PX are disposed. Here, the pixel PX includes a gate electrode 121, a source electrode 173, a semiconductor layer 154, a drain electrode 175, a pixel electrode 191, and a common electrode 270.

First, the first display panel 100 will be described.

The data line 171 and a first gate insulating layer 140 are disposed on the first substrate 110. The gate line 171 mainly extends in a vertical direction and includes a source electrode 173. A thickness of the first gate insulating layer 140 may be the same as a thickness of the data line 171.

On the source electrode 173, a first ohmic contact layer 163, a semiconductor layer 154, a second ohmic contact layer 165, and a drain electrode 175 are sequentially disposed.

On the first gate insulating layer 140, the gate line 121 and the second gate insulating layer 145 are disposed.

The gate line 121 extends in a parallel direction with the data line 171 and includes a gate electrode 124 protruding in the semiconductor layer 154 direction.

The second gate insulating layer 145 is disposed between the gate electrode 124 and the first ohmic contact layer 163, the semiconductor layer 154, and the second ohmic contact layer 165.

A thickness of the gate electrode 124 may be the same as a thickness which is the sum of thicknesses of the first ohmic contact layer 163, the semiconductor layer 154, and the second ohmic contact layer 165.

The gate electrode 124, the source electrode 173, and the drain electrode 175 form a thin film transistor (TFT) together with the semiconductor layer 154, and a channel of the thin film transistor is formed in the semiconductor layer 154 between the source electrode 173 and the drain electrode 175.

On the first gate insulating layer 140, the gate line 121, the second gate insulating layer 145, and the drain electrode 175, a first passivation layer 180p is disposed.

The first passivation layer 180p may be made of an inorganic insulating material such as silicon nitride or silicon oxide. A contact hole 185 exposing the drain electrode 175 is formed in the first passivation layer 180p.

The pixel electrode 191 connected with the drain electrode 175 is disposed on the first passivation layer 180p through the contact hole 185. The pixel electrode 191 has a plate planar shape and may be disposed in the pixel as a whole plate. Further, the pixel electrode 191 has a substantially quadrangular shape and a structure in which the X-axis directional length is larger than the Y-axis directional length.

A second passivation layer 180q is disposed on the first passivation layer 180p and the pixel electrode 191. The second passivation layer 180q may be made of an organic insulating material.

The common electrode 270 is disposed on the second passivation layer 180q. The common electrode 270 includes a plurality of branch electrodes 271. The common electrode 270 is connected with the common electrode 270 disposed in an adjacent pixel in a row direction through a connection part 275 and may receive a common voltage having a predetermined magnitude which is supplied from the outside of the display area D.

Next, the second display panel 200 will be described.

A light blocking member 220 and a color filter 230 are disposed on a second substrate 210. The light blocking member 220 partitions the pixel area, and the color filter 230 is disposed in a region partitioned by the light blocking member 220. An overcoat layer 280 may also be formed on both the color filter 230 and the light blocking member 220. Overcoat layer 280 may prevent the color filter 230 from being lifted and suppress the contamination of the liquid crystal layer 3 due to an organic material such as a solvent flowing into from the color filter 230, thereby preventing defects such as an afterimage which may be caused when a screen is driven.

Further, the present invention is not limited thereto, and the light blocking member 220 and the color filter 230 may also be positioned on the first display panel 100.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS

110: First substrate
121: Gate line
124: Gate electrode
140: First gate insulating layer
145: Second gate insulating layer
154: Semiconductor layer
171: Data line
173: Source electrode
175: Drain electrode
180: Passivation layer
180p: First passivation layer
180q: Second passivation layer
191: Pixel electrode
210: Second substrate
230: Color filter
270: Common electrode
400: Gate driver
500: Data driver

What is claimed is:

1. A liquid crystal display, comprising:
a first substrate including a display area displaying an image and a peripheral area surrounding the display area;
a data line disposed on the first substrate in the display area and including a source electrode;
a first gate insulating layer disposed at a portion except for the portion where the data line is disposed on the first substrate;
a semiconductor layer disposed on the source electrode;
a drain electrode disposed on the semiconductor layer;
a gate line disposed on the first gate insulating layer in the display area and including a gate electrode;
a second gate insulating layer disposed between the gate electrode on the first gate insulating layer and the semiconductor layer;
a gate driver disposed in the peripheral area and connected with the gate line; and
a data driver disposed in the peripheral area and connected with the data line,
wherein:
the gate line and the data line extend in the same direction to each other;
the gate line and the data line are disposed on different layers from each other;
the gate driver and the data driver face each other with the display area therebetween; and
the data driver is spaced apart from the gate driver in a direction where each of the gate line and the data line extend by the display area.

2. The liquid crystal display of claim 1, wherein the gate line and the data line are adjacent to each other.

3. The liquid crystal display of claim 2, wherein the thickness of the source electrode is the same as the thickness of the first gate insulating layer.

4. The liquid crystal display of claim 3, further comprising:
   a passivation layer disposed on the first gate insulating layer, the gate line, the second gate insulating layer, the data line, and the drain electrode and including a contact hole exposing the drain electrode; and
   a pixel electrode disposed on the passivation layer and connected with the drain electrode through the contact hole.

5. The liquid crystal display of claim 4, wherein in the pixel electrode, an X-axis directional length is larger than a Y-axis directional length, and
   the Y-axis direction being parallel to a direction where the gate line and the data line extend.

6. The liquid crystal display of claim 5, further comprising:
   a second substrate facing the first substrate;
   a light blocking member and a color filter disposed on the second substrate;
   a common electrode disposed on the light blocking member and the color filter; and
   a liquid crystal layer disposed between the first substrate and the second substrate.

7. The liquid crystal display of claim 3, further comprising:
   a first passivation layer disposed on the first gate insulating layer, the gate line, the second gate insulating layer, the data line, and the drain electrode;
   a common electrode disposed on the first passivation layer;
   a second passivation layer disposed on the first passivation layer and the common electrode; and
   a pixel electrode disposed on the second passivation layer, wherein a contact hole exposing the drain electrode is formed in the first passivation layer and the second passivation layer, and
   the pixel electrode is connected with the drain electrode through the contact hole.

8. The liquid crystal display of claim 7, wherein in the pixel electrode, an X-axis directional length is larger than a Y-axis directional length, and
   the Y-axis direction being parallel to a direction where the gate line and the data line extend.

9. The liquid crystal display of claim 8, wherein the pixel electrode includes a plurality of branch electrodes.

10. The liquid crystal display of claim 9, further comprising:
    a second substrate facing the first substrate;
    a light blocking member and a color filter disposed on the second substrate; and
    a liquid crystal layer disposed between first substrate and the second substrate.

11. The liquid crystal display of claim 3, further comprising:
    a first passivation layer disposed on the first gate insulating layer, the gate line, the second gate insulating layer, the data line, and the drain electrode and including a contact hole exposing the drain electrode;
    a pixel electrode disposed on the first passivation layer and connected with the drain electrode through the contact hole;
    a second passivation layer disposed on the first passivation layer and the pixel electrode; and
    a common electrode disposed on the second passivation layer.

12. The liquid crystal display of claim 11, wherein in the pixel electrode, an X-axis directional length is larger than a Y-axis directional length, and
    the Y-axis direction being parallel to a direction where the gate line and the data line extend.

13. The liquid crystal display of claim 12, wherein the common electrode includes a plurality of branch electrodes.

14. The liquid crystal display of claim 13, further comprising:
    a second substrate facing the first substrate;
    a light blocking member and a color filter disposed on the second substrate; and
    a liquid crystal layer disposed between the first substrate and the second substrate.

15. The liquid crystal display of claim 1, wherein planar shapes of the source electrode, the semiconductor layer and the drain electrode are the same as each other and are coincident.

* * * * *